United States Patent
Wu et al.

(10) Patent No.: US 12,222,642 B2
(45) Date of Patent: Feb. 11, 2025

(54) PHOTOSENSITIVE COMPOSITION, COLOR FILTER AND METHOD FOR FORMING THE COLOR FILTER

(71) Applicant: eChem Solutions Corp., Taoyuan (TW)

(72) Inventors: Yi-Sheng Wu, Taoyuan (TW); Hsin-Chieh Yang, Taoyuan (TW); Ping-Sung Tsai, Taoyuan (TW)

(73) Assignee: eChem Solutions Corp., Taoyuan (TW)

( * ) Notice: Subject to any disclaimer, the term of this patent is extended or adjusted under 35 U.S.C. 154(b) by 95 days.

(21) Appl. No.: 16/431,752

(22) Filed: Jun. 5, 2019

(65) Prior Publication Data
US 2020/0019055 A1    Jan. 16, 2020

(30) Foreign Application Priority Data
Jul. 11, 2018 (TW) ................. 107123986

(51) Int. Cl.
| | | |
|---|---|---|
| *G03F 7/00* | (2006.01) | |
| *G02B 1/04* | (2006.01) | |
| *G03F 7/031* | (2006.01) | |
| *G03F 7/033* | (2006.01) | |
| *G02F 1/1335* | (2006.01) | |

(52) U.S. Cl.
CPC ............ *G03F 7/0007* (2013.01); *G02B 1/04* (2013.01); *G03F 7/031* (2013.01); *G03F 7/033* (2013.01); *G02F 1/133514* (2013.01)

(58) Field of Classification Search
CPC ...... G03F 7/0046; G03F 7/032; G03F 7/0757; G03F 7/105; G03F 7/0388; G03F 7/027; G03F 7/0007; G03F 7/031; G03F 7/033; G02B 5/223; G02B 5/22; G02B 5/201; G02B 1/041; G02B 1/04; G02F 1/133514; C08F 2/48; C08F 220/1806; C08F 220/36; C08F 220/365; C08F 220/18; C08L 33/08; C08L 33/10; H01L 27/14627; H01L 27/14623
See application file for complete search history.

(56) References Cited

U.S. PATENT DOCUMENTS

| | | | | |
|---|---|---|---|---|
| 2009/0246651 A1* | 10/2009 | Fujimori | ................. | G03F 7/031 |
| | | | | 430/7 |
| 2013/0028587 A1* | 1/2013 | Kaneko | ................. | G02B 1/041 |
| | | | | 396/439 |
| 2016/0327859 A1 | 11/2016 | Idei et al. | | |

FOREIGN PATENT DOCUMENTS

| | | | | |
|---|---|---|---|---|
| CN | 103765314 | | 4/2014 | |
| JP | S5492723 | | 7/1979 | |
| JP | 2007041282 | | 2/2007 | |
| JP | 2014167492 A | * | 9/2014 | ............ G03F 7/032 |
| JP | 2016164623 | | 9/2016 | |
| TW | 303640 | | 12/2008 | |
| WO | WO-2017159634 A1 | * | 9/2017 | ............ C09B 57/00 |

OTHER PUBLICATIONS

English Translation of JP 2014167492 A; Koo, Masaki; Sep. 11, 2014.*
English Translation of WO 2017/159634 A1; Kimoto Hiroki; Published: Sep. 21, 2017 (Year: 2017).*
"Office Action of Taiwan Counterpart Application", issued on Dec. 22, 2018, p. 1-p. 6.
"Office Action of China Counterpart Application", issued on Aug. 3, 2022, p. 1-p. 9.

* cited by examiner

*Primary Examiner* — Sean M DeGuire
*Assistant Examiner* — Richard David Champion
(74) *Attorney, Agent, or Firm* — JCIPRNET

(57) ABSTRACT

A photosensitive composition, a color filter prepared by using the photosensitive composition and a method for preparing the color filter. The photosensitive composition includes an alkali-soluble resin (A); an ethylenically unsaturated monomer (B); a photopolymerization initiator (C); a solvent (D); and a colorant (E), wherein the content of the photopolymerization initiator (C) is from 32 parts by weight to 70 parts by weight based on 100 parts by weight of the ethylenically unsaturated monomer(B).

8 Claims, No Drawings

PHOTOSENSITIVE COMPOSITION, COLOR FILTER AND METHOD FOR FORMING THE COLOR FILTER

CROSS-REFERENCE TO RELATED APPLICATION

This application claims the priority benefit of Taiwan application serial no. 107123986, filed on Jul. 11, 2018. The entirety of the above-mentioned patent application is hereby incorporated by reference herein and made a part of this specification.

BACKGROUND

1. Field of the Invention

The invention relates to a photosensitive composition, a color filter formed by using the photosensitive composition, and a method of forming the color filter. In particular, the invention relates to a photosensitive composition by which a uniform and high-resolution pattern can be obtained when patterning is performed, a color filter formed using the photosensitive composition, and a method of forming the color filter.

2. Description of Related Art

Color filters are one of the key components of liquid crystal displays and image sensors. In a general method of preparing a color filter, a photosensitive composition is used as a photoresist material to perform patterning on a substrate for a color filter. When patterning is performed on a larger substrate, patterning may be performed by multiple block patterning to complete all of the patterns on the larger substrate. The multiple block patterning may cause differences in pattern size, thickness and surface condition, and cause unevenness in different degrees, and also cause resolution and pattern degradation.

In addition, since the lens set of the apparatus for performing patterning is composed of a plurality of strip lenses arranged in parallel with each other, the junction of any two adjacent strip lenses has an overlapping area. When the light passes through these overlapping areas, the intensity of the light is weakened. In other words, under the same exposing conditions, the exposure dose of the photoresist material layer corresponding to the overlapping areas may be insufficient due to the existence of the overlapping areas, resulting in a photoresist pattern having a smaller line width and larger space. In this way, the strip pattern formed by using the photoresist pattern as a mask may have different line/space ratios, resulting in a problem of bright and dark lines on the display screen of the display, so-called lens mura.

With the increase in the size and resolution of liquid crystal displays, the above-mentioned situation is more obvious. Therefore, how to mitigate the pattern unevenness which occurs when the color filter is formed and the resulting lens mura are the subjects actively studied by those skilled in the art.

SUMMARY

Accordingly, various photosensitive compositions are disclosed. When the photosensitive composition in one embodiment is used for patterning, a uniform and high-resolution pattern can be obtained, and the phenomenon of the lens mura of the display panel can be improved. By adjusting the type and ratio of each component in the photosensitive composition, the exposure uniformity of the photosensitive composition can be improved.

The photosensitive composition in one embodiment may comprise an alkali-soluble resin (A); an ethylenically unsaturated monomer (B); a photopolymerization initiator (C); a solvent (D); and a colorant (E). The content of photopolymerization initiator (C) is in an amount of from 32 parts by weight to 70 parts by weight based on 100 parts by weight of the ethylenically unsaturated monomer (B).

In an embodiment of the invention, a monomer forming the alkali-soluble resin (A) may comprise a monomer represented by formula (1) below,

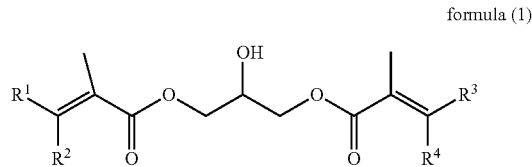

formula (1)

in formula (1), $R^1$ to $R^4$ are each independently hydrogen, methyl group or ethyl group. The content of the monomer represented by the formula (1) is from 15 mol % to 50 mol % based on the total moles of the monomers forming the alkali-soluble resin (A).

In an embodiment of the invention, the monomer forming the alkali-soluble resin (A) may further comprise one or more monomers selected from the group consisting of an acrylic compound, a styrene-based compound, and a maleimide-based compound.

In an embodiment of the invention, the photopolymerization initiator (C) may comprise at least a compound represented by formula (2) and at least a compound represented by formula (3) in a weight ratio of 4:1 to 1:1.

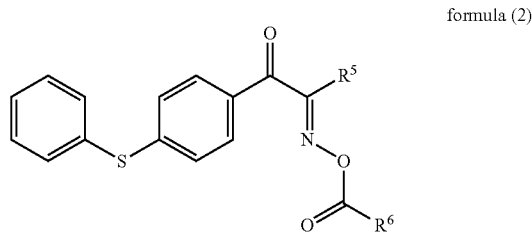

formula (2)

In formula (2), $R^5$ and $R^6$ are each independently hydrogen, C1-C20 alkyl group, C3-C8 cycloalkyl group, C2-C5 alkenyl group, substituted or unsubstituted C6-C20 aryl, or C7-C20 heteroaryl group.

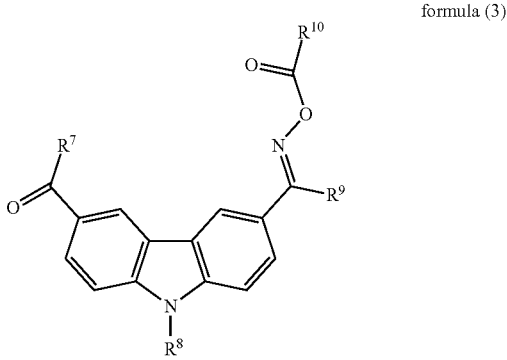

formula (3)

In formula (3), $R^7$ is substituted or unsubstituted C6-C20 aryl group, or C7-C20 heteroaryl group; $R^8$ is C1-C20 alkyl group, C2-C5 alkenyl group, C3-C10 cycloalkyl group, phenyl, or benzyl group; and $R^9$ and $R^{10}$ are each independently C1-C20 alkyl group, C3-C8 cycloalkyl group, C2-C5 alkenyl group, substituted or unsubstituted C6-C20 aryl group, or C7-C20 heteroaryl group.

In an embodiment of the invention, the colorant (E) may comprise an organic pigment, an inorganic pigment or a combination thereof. The organic pigment may comprise diketopyrrolopyrrole-type pigment, anthraquinone-type pigment, dianthraquinone-type pigment, phthalocyanine-type pigment, benzimidazolone-type pigment, dioxazine-type pigment, azo-type pigment, thiazinium blue-type pigment, quinacridone-type pigment or a combination thereof.

In an embodiment of the invention, the solvent (D) may comprise a mixture of propylene glycol methyl ether acetate and a high boiling point solvent having a boiling point more than 145° C.

In an embodiment of the invention, a weight ratio of the propylene glycol methyl ether acetate and the high boiling points solvent is 7:1 to 2:1.

In an embodiment of the invention, the high boiling point solvent may comprise ethyl 3-ethoxypropionate (EEP), ethyl pyruvate (PE), ethyl lactate, butyl lactate, benzyl alcohol, 3-methoxybutyl acetate (MBA), 3-methoxy 3-methylbutanol, γ-butyrolactone, or propylene glycol monobutyl ether.

Besides, various methods of forming a color filter, which comprises coating the photosensitive composition mentioned above on a surface of a substrate, are disclosed.

In addition, various color filters formed by the method mentioned above are disclosed.

In light of the foregoing, when the photosensitive composition in one embodiment is subjected to patterning, a pattern having a good exposure uniformity and a good resolution can be obtained, and the color filter formed using the photosensitive composition may not cause lens mura.

DESCRIPTION OF THE EMBODIMENTS

Various photosensitive compositions which may be used for a color filter are disclosed. When a patterning process is performed on the color filter with the photosensitive composition, a uniform and well resolved pattern may be obtained. Hereinafter, the specific embodiments are described as examples in which the present invention may be implemented. However, these embodiments are illustrative, and the disclosure of the present invention is not limited thereto.

<Photosensitive Composition>

Various photosensitive compositions, which may comprise an alkali-soluble resin (A); an ethylenically unsaturated monomer (B); a photopolymerization initiator (C); a solvent (D); and a colorant (E), are disclosed. Further, the photosensitive composition may further include an additive such as a leveling agent as needed. Hereinafter, the respective components mentioned above will be described in detail.

It should be noted that "(meth)acrylic acid" is used to represent acrylic acid and/or methacrylic acid, and "(meth)acrylate" is used to represent acrylate and/or methacrylate in the following.

Alkali-Soluble Resin (A)

The alkali-soluble resin (A) may be formed by copolymerizing a monomer represented by formula (1), a monomer of an unsaturated carboxylic acid or an unsaturated carboxylic anhydride, and a monomer of other unsaturated compound.

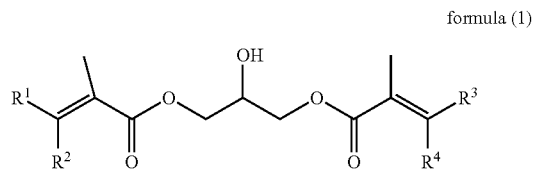

formula (1)

In formula (1), $R^1$ to $R^4$ are each independently hydrogen, methyl group or ethyl group.

For the monomer represented by the formula (1), it may be a copolymer of (meth)acrylic acid and glycidyl (meth)acrylate, for example.

Based on the total moles of the monomers forming the alkali-soluble resin (A), the content of the monomer represented by the formula (1) may be from 10 mol % to 70 mol %, preferably 15% to 50 mol %, and more preferably from 15 mol % to 35 mol %.

When the monomer represented by the formula (1) is used in the alkali-soluble resin (A), the reactive effect of the photosensitive composition can be increased, and the exposure uniformity at the time of patterning can be better. Meanwhile, when the amount of the compound represented by the formula (1) falls within the above range, a photosensitive composition having a good uniformity can be obtained.

For the monomer of the unsaturated carboxylic acid or the unsaturated carboxylic anhydride, there is no particular limitations thereto, and an unsaturated carboxylic acid or an unsaturated carboxylic anhydride known in the art may be used. For example, the unsaturated carboxylic acid or unsaturated carboxylic anhydride may be acrylic acid, methacrylic acid, 2-methylpropenyl ethoxy succinate, butenoic acid, α-chloroacrylic acid, ethyl acrylic acid, cinnamon acid, maleic acid, maleic anhydride, fumaric acid, itaconic acid, itaconic anhydride, citraconic acid, citraconic anhydride, or any anhydride thereof, or any mixtures thereof. The unsaturated carboxylic acid or unsaturated carboxylic anhydride is preferably acrylic acid, methacrylic acid, 2-methylpropenyl ethoxy succinate, or any anhydride thereof, or any mixtures thereof.

Based on the total moles of the monomers forming the alkali-soluble resin (A), the content of the monomer of the unsaturated carboxylic acid or the unsaturated carboxylic anhydride may be from 10 mol % to 80 mol %, preferably 10 to 50 mol %, and more preferably from 20 mol % to 30 mol %.

For the monomer of the other unsaturated compound, there is no particular limitation thereto, and an unsaturated compound known in the art may be used. For example, the other unsaturated compound may be an acrylic compound, a styrene-based compound, and a maleimide-based compound.

The acrylic compound above may be, for example, (meth) acrylic acid, alkyl (meth)acrylate, hydroxyl group-containing (meth)acrylate, ether group-containing(meth)acrylate, cyclic (meth)acrylate, or the like, but is not limited thereto. The alkyl (meth)acrylate above may be methyl (meth) acrylate, ethyl (meth)acrylate, propyl (meth)acrylate, butyl (meth)acrylate, tert-butyl (meth)acrylate, benzyl (meth) acrylate, lauryl (meth)acrylate, for example. The hydroxyl group-containing (meth)acrylate may be hydroxyethyl (meth)acrylate, hydroxypropyl (meth)acrylate, ethoxyethyl (meth)acrylate, glycidyl (meth)acrylate, for example. The cyclic (meth)acrylate above may be cyclohexyl (meth)acrylate, isophorone (meth)acrylate, dicyclopentadienyl (methyl)acrylate, for example.

The styrene-based compound above may be styrene, α-methylstyrene, vinyl toluene, p-chlorostyrene, divinylbenzene, o-methoxystyrene, m-methoxystyrene, p-methoxystyrene, o-methoxymethylstyrene, m-methoxymethylstyrene, p-methoxymethylstyrene, or the like, but is not limited thereto.

The maleimide-based compound above may be N-phenylmaleimide, N-o-hydroxyphenylmaleimide, N-m-hydroxyphenylmaleimide, N-p-hydroxyphenylmaleimide, N-o-methylphenylmaleimide, N-m-methylphenylmaleimide, N-p-methylphenylmaleimide, N-o-methoxyphenylmaleimide, N-m-methoxyphenylmaleimide, N-p-methoxyphenylmaleimide, N-cyclohexylmaleimide, or the like, but is not limited thereto.

Based on the total moles of the monomers forming the alkali-soluble resin (A), the content of the monomer of the other unsaturated compound may be from 10 mol % to 80 mol %, preferably 15 to 70 mol %, and more preferably from 40 mol % to 60 mol %.

The method for synthesizing the alkali-soluble resin (A) is not particularly limited, as long as a compound represented by the formula (1), an unsaturated carboxylic acid or an unsaturated carboxylic anhydride, and other unsaturated compounds are appropriately used to react under appropriate reaction conditions, and the alkali-soluble resin (A) may be obtained.

For example, the alkali-soluble resin (A) may be formed by adding a carboxylic acid-containing compound, such as (meth)acrylic acid, into a copolymer of an epoxy group-containing (meth)acrylate, such as glycidyl methacrylate, or a copolymer of the epoxy group-containing (meth)acrylate and another (meth) acrylate.

In the photosensitive composition of one embodiment, the alkali-soluble resin (A) may be a single alkali-soluble resin or a mixture of two or more alkali-soluble resins.

The alkali-soluble resin (A) may have a weight average molecular weight of from 5,000 to 50,000, preferably from 10,000 to 45,000. The weight average molecular weight of the alkali-soluble resin (A) may be measured by a gel permeation chromatography (GPC).

In the photosensitive composition of one embodiment, the content of the alkali-soluble resin (A) may be from 100 parts by weight to 200 parts by weight and preferably 150 parts by weight, based on 100 parts by weight of the ethylenically unsaturated monomer (B).

Ethylenically Unsaturated Monomer (B)

There is no particular limits to the ethylenically unsaturated monomer (B). Ethylenically unsaturated monomer (B) known in the art may be used. For example, the ethylenically unsaturated monomer (B) may be a polyfunctional vinyl monomer having at least 3 polymerizable ethylenically unsaturated groups, such as a compound obtained by reacting an α,β-unsaturated carboxylic acid with a polyol, or a compound obtained by adding an α,β-unsaturated carboxylic acid to a glycidyl group-containing compound. The compound obtained by reacting an α,β-unsaturated carboxylic acid with a polyol may be trimethylolpropane tri(meth) acrylate, tetramethylol methane tri(meth)acrylate, tetrahydroxymethylmethane tetra(meth)acrylate, dipentaerythritol hexa(meth)acrylate, or the like The compound obtained by adding an α,β-unsaturated carboxylic acid to a glycidyl group-containing compound may be trihydroxymethylpropane triglycidyl ether triacrylate, or the like.

Specific examples of the ethylenically unsaturated monomer (B) may be commercially available products, such as products manufactured by Japan Synthetic Chemical Industry Co., Ltd. with trade name of UV1700B, UV6300B or UV7640B, etc.); products manufactured by NIPPON KAYAYU with trade name of DPHA, DPHA-40H, DPEA-12, DPCA-20, DPCA-60, R-604, PET-30, GPO-303 or UX5001T, etc.; products manufactured by Gensei Industrial Co., Ltd. with trade name of UN3320HS, UN904, UN907, UN3320HC, etc.; or products manufactured by Shin-Nakamura Chemical Co., Ltd. with trade name of A-DPH, A-9550 or AD-TMP, etc. The ethylenically unsaturated monomer (B) is preferably DPHA, DPEA-12 or a combination thereof.

In the photosensitive composition of one embodiment, the ethylenically unsaturated monomer (B) may be used alone or in combination of two or more.

Photopolymerization Initiator (C)

The photopolymerization initiator (C) may be a composition including at least two photopolymerization initiators. For example, the photopolymerization initiator (C) may include at least one oxime ester compound having a diphenyl sulfide skeleton represented by the formula (2) and at least one oxime ester compound having a carbazole skeleton represented by the formula (3).

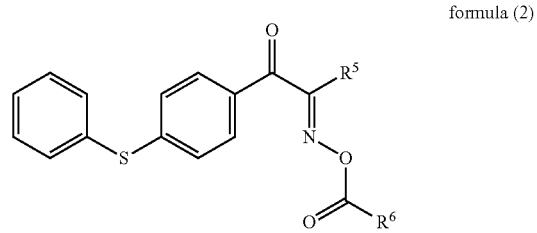

formula (2)

In formula (2), $R^5$ and $R^6$ are each independently hydrogen, C1-C20 alkyl group, C3-C8 cycloalkyl group, C2-C5 alkenyl group, substituted or unsubstituted C6-C20 aryl, or C7-C20 heteroaryl group.

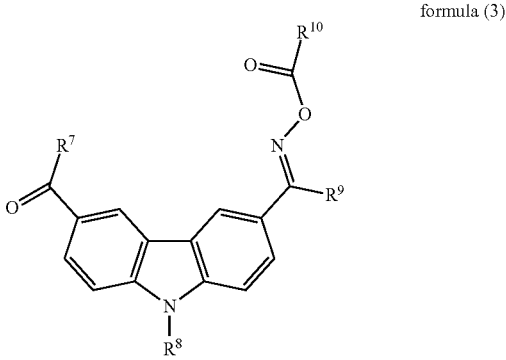

formula (3)

In formula (3), $R^7$ is substituted or unsubstituted C6-C20 aryl group, or C7-C20 heteroaryl group; $R^8$ is C1-C20 alkyl group, C2-C5 alkenyl group, C3-C10 cycloalkyl group, phenyl, or benzyl group; and $R^9$ and $R^{10}$ are each independently C1-C20 alkyl group, C3-C8 cycloalkyl group, C2-C5 alkenyl group, substituted or unsubstituted C6-C20 aryl group, or C7-C20 heteroaryl group.

Herein, the C1-C20 alkyl group may be, for example, methyl, ethyl, propyl, isopropyl, n-butyl, sec-butyl, isobutyl, tert-butyl, pentyl, hexyl, heptyl, 2,4,4-trimethylpentyl, 2-ethylhexyl, octyl group, or the like, but is not limited thereto.

Herein, the C2-C5 alkenyl group may be, for example, a vinyl group, an allyl group, a butenyl group, a pentenyl group or the like, but is not limited thereto.

Herein, the C3-C10 cycloalkyl group may be, for example, an alkyl group containing at least one ring. For example, the cycloalkyl group may be a cyclopropyl group, a cyclobutyl group, a cyclopentyl group, a cyclohexyl group, a cyclooctyl group, a cyclopentylpropyl group, or the like, but is not limited thereto.

Herein, the substituted or unsubstituted C6-C20 aryl group may be, for example, a phenyl group, a benzyl group, a naphthyl group, an anthracenyl group, a phenanthryl group, a styryl group, or the like, but is not limited thereto.

Herein, the C7-C20 heteroaryl group may be, for example, a pyridyl group, a thienyl group, a benzothienyl group, a furyl group, a benzofuranyl group, a pyrrolyl group, or the like, but is not limited thereto.

For example, the oxime ester compound having a diphenyl sulfide skeleton represented by the formula (2) may be a commercially available product, such as Irgacure® OXE01 (BASF Corporation), Irgacure® OXE04 (BASF Corporation), TR-PBG-305 (Changzhou Tronly New Electronic Materials Co., Ltd.), TR-PBG-3057 (Changzhou Tronly New Electronic Materials Co., Ltd.), NCI-730 (ADEKA Co., Ltd.), NCI-930 (ADEKA Co., Ltd.), or the like, but is not limited thereto.

For example, the oxime ester compound having a carbazole skeleton represented by the formula (3) may be a commercially available product, such as Irgacure® OXE02 (BASF Corporation), Irgacure® OXE03 (BASF Corporation), TR-PBG-304 (Changzhou Tronly New Electronic Materials Co., Ltd.), NCI-1919 (ADEKA Co., Ltd.), NCI-831 (ADEKA Co., Ltd.), or the like, but is not limited thereto.

In an exemplary embodiment of the invention, the photopolymerization initiator (C) may further include other photopolymerization initiators known in the art. For example, other photopolymerization initiators may be Irgacure® 369 (BASF Corporation), Irgacure® 907 (BASF Corporation), Irgacure® 819 (BASF Corporation), Chemcure-MEK (Chembridge International Corp.), or the like, but is not limited thereto.

In the photopolymerization initiator (C), the weight ratio of the compound represented by the formula (2) to the compound represented by the formula (3) may be 4:1 to 1:1.

In the photosensitive composition of one embodiment, the content of the photopolymerization initiator (C) may be 32 parts by weight to 70 parts by weight, based on 100 parts by weight of the ethylenically unsaturated monomer (B).

The photopolymerization initiator (C) of one embodiment can remarkably improve the reactivity of the photosensitive composition, improve the uniformity of the pattern, and suppress the lens mura, and a uniform and high-resolution pattern can be obtained when a patterning process is performed with the photosensitive composition.

Solvent (D)

The solvent (D) of one embodiment may be a mixture comprising propylene glycol methyl ether acetate and a high boiling point solvent having a boiling point higher than the boiling point (145° C.) of propylene glycol methyl ether acetate.

For example, the high boiling point solvent may include ethyl 3-ethoxypropionate (EEP), ethyl pyruvate (PE), ethyl lactate, butyl lactate, benzyl alcohol, 3-methoxybutyl acetate (MBA), 3-methoxy-3-methylbutanol, γ-butyrolactone or propylene glycol monobutyl ether.

The weight ratio of propylene glycol methyl ether acetate to high boiling solvent may range from 7:1 to 2:1.

When the mixture comprising the propylene glycol methyl ether acetate and the high boiling point solvent having a boiling point higher than 145° C. is used as a solvent, the drying rate of the photosensitive composition can be slowed down at the nozzle for injecting the photosensitive composition, so that the maintenance number of the nozzles by the production line staff may be decreased to improve the efficiency of the production line.

Colorant (E)

The colorant (E) is not particularly limited, and a colorant known in the art can be used. For example, the colorant (E) may be formed by grinding and dispersing one or more organic pigments, inorganic pigments, or a combination thereof. The organic pigment may be diketopyrrolopyrrole-type pigment, anthraquinone-type pigment, dianthraquinone-type pigment, phthalocyanine-type pigment, benzimidazolone-type pigment, dioxazine-type pigment, azo-type pigment, thiazinium blue-type pigment, quinacridone-type pigment or a combination thereof, for example. Examples of the organic pigments include C.I. Pigment Red 1, 2, 3, 4, 5, 6, 7, 8, 9, 10, 11, 12, 14, 15, 16, 17, 18, 19, 21, 22, 23, 30, 31, 32, 37, 41, 122, 123, 144, 146, 149, 166, 168, 170, 171, 172, 174, 175, 176, 177, 178, 179, 180, 185, 187, 188, 202, 206, 207, 208, 209, 220, 224, 242, 254, 262, 264, 265, 269, 272; C.I. Pigment Orange 5, 13, 24, 34, 36, 38, 40, 43, 46, 49, 51, 61, 63, 64, 70, 71, 72, 73, 74; C.I. Pigment Yellow 11, 12, 13, 14, 17, 20, 24, 31, 53, 55, 71, 73, 74, 83, 93, 98, 108, 110, 126, 138, 139, 150, 153, 154, 155, 156, 166, 168, 175, 180, 185, 219; C.I. Pigment Green 7, 36, 37, 58, 59; C.I. Pigment Blue 15, 15:3, 15:4, 15:6, 16, 18 19, 22, 60, 66; C.I. Pigment Violet 1, 19, 23, 27, 29, 30, 32, 36, 37, 40, 42; and C.I. Pigment Black 1, 7, and the like The inorganic pigment may be, for example, titanium oxide, barium sulfate, calcium carbonate, zinc oxide, lead sulfate, yellow lead, zinc yellow, iron oxide (red iron oxide (III)), cadmium red, ultramarine blue, indigo, chrome oxide green, cobalt green, amber, titanium black, synthetic iron black, carbon black, or the like.

The colorant (E) may be used in an amount of 30 parts by weight to 300 parts by weight, preferably 40 parts by weight to 250 parts by weight, more preferably from 100 parts by weight to 200 parts by weight, based on 100 parts by weight of the ethylenically unsaturated monomer (B).

Additive (F)

In an embodiment of the invention, the photosensitive composition may further include an additive (F).

In an embodiment of the invention, the additive (F) may be a leveling agent. The leveling agent may be polymeric or non-polymeric. Specific examples of the polymeric leveling agent include polyethyleneimine, polyamide, and a reaction product of an amine and an epoxide, and specific examples of the non-polymeric leveling agent include a non-polymeric sulfur-containing compound and a non-polymeric nitrogen-containing compound, but the examples are not limited thereto. Moreover, all leveling agent generally used in the art may be used.

The leveling agents may be used alone or in combination.

The leveling agent used in one embodiment may be a commercially available product such as BYK-307 (polysiloxane-based surfactant, BYK Chemical Co., Ltd.), BYK-323 (polysiloxane-based surfactant, BYK Chemical Co., Ltd.), BYK-348 (polysiloxane-based surfactant, BYK Chemical Co., Ltd.), BYK-333 (silicone-based surfactant, BYK Chemical Co., Ltd.), F-477 (fluorine-based surfactant, DIC Co., Ltd.), F-554 (fluorine-based surfactant, DIC Co., Ltd.), F-556 (fluorine-based surfactant, DIC Co., Ltd.), F-563 (fluorine-based surfactant, DIC Co., Ltd.), F-575 (fluorine-based surfactant, DIC Co., Ltd.), RS-72-K (fluorine-based surfactant, DIC Co., Ltd.), KP323 (polysiloxane-based surfactant, Shin-Etsu Chemical Co., Ltd.), KP324 (polysiloxane-based surfactant, Shin-Etsu Chemical Co., Ltd.), KP340 (polysiloxane-based surfactant, Shin-Etsu Chemical Co., Ltd.), KP341 (polysiloxane-based surfactant, Shin-Etsu Chemical Co., Ltd.), or the like, but is not limited thereto.

In the photosensitive composition of one embodiment, the content of the additive (F) is from 30 parts by weight to 70 parts by weight, based on 100 parts by weight of the ethylenically unsaturated monomer (B).

<Method of Preparing Photosensitive Composition>

The method for preparing the photosensitive composition is not particularly limited. For example, the photosensitive composition may be prepared by the following methods. An alkali-soluble resin (A), an ethylenically unsaturated monomer (B), a photopolymerization initiator (C), a solvent (D), and a colorant (E) are placed in a stirrer and then stirred to be evenly mixed into a solution state. A leveling agent may be added if necessary. After uniformly mixing, a photosensitive composition in a solution state may be obtained.

Alternatively, the photosensitive composition may also be prepared by, for example, dispersing portions of the alkali-soluble resin (A) and the ethylenically unsaturated monomer (B) in a portion of the solvent (D) to form a dispersion solution, and then mixing the remaining alkali-soluble resin (A), ethylenically unsaturated monomer (B), photopolymerization initiator (C), solvent (D), and colorant (E).

Alternatively, the photosensitive composition may also be prepared by dispersing a portion of the colorant (E) in a portion of the solvent (D) to form a pigment dispersion; and then mixing the remaining colorant (E), alkali-soluble resin (A), and ethylenically unsaturated monomer (B), the photopolymerization initiator (C), and the solvent (D). Further, the above-described colorant (E) dispersion step may be carried out by a mixer, such as a bead mill or a roll mill.

<Color Filter and Method of Forming Same>

An exemplary embodiment of the present invention provides a color filter formed by using the above-described photosensitive composition.

The color filter may be formed by coating the above photosensitive composition on a substrate to form a coating film, as well as exposing, developing, and curing the coating film.

The substrate above may be a glass plate, a silicon wafer, or a plastic substrate, such as a polyether sulfone (PES) plate and a polycarbonate (PC) plate, and the type of the substrate is not particularly limited.

The coating method is not particularly limited, but a spray coating method, a roll coating method, a spin coating method, and the like may be used. In general, a spin coating method is widely used. Further, after a coating film is formed, in some cases, the residual solvent may be partially removed under reduced pressure.

The curing method is not particularly limited, and for example, curing may be performed using a light source of mercury vapor arc, carbon arc, Xe arc, and the like, which emits light at a wavelength of 250 nm to 450 nm, but is not limited thereto.

Hereinafter, the present invention will be described in detail with reference to examples. The following examples are provided to describe the invention, and the scope of the invention includes the categories described in the following claims and their substitutions and modifications, and are not limited to the scope of the examples.

Synthesis Examples of Alkali-Soluble Resin (A)

Synthesis Example 1: Preparation of Alkali-Soluble Resin A-1

185 parts by mole of propylene glycol methyl ether acetate, 2.0 parts by mole of azobisisobutyronitrile (AIBN), 50.0 parts by mole of benzyl methacrylate, 25.0 parts by mole of acrylic acid, and 25.0 parts by mole of acrylic acid-glycidyl methacrylate copolymer were introduced into an Erlenmeyer flask equipped with a stirrer, a thermometer, a reflux cooling tube, a titration device, and a nitrogen introduction tube, and the air in the Erlenmeyer flask is exchanged with nitrogen. Next, the reaction was carried out for 6 hours while raising the temperature to 110° C. and stirring. The synthesized alkali-soluble resin (A-1) had an acid value of 104.06 mg KOH/g, and a weight average molecular weight (Mw) of about 15,000 as measured by GPC.

Synthesis Example 2: Preparation of Alkali-Soluble Resin A-2

120 parts by mole of diethylene glycol ether, 2.0 parts by mole of azobisisobutyronitrile (AIBN), 25.0 parts by mole of benzyl methacrylate, 20.0 parts by mole of acrylic acid, 15.0 parts by mole of methyl methacrylate, 35.0 parts by mole of acrylic acid-glycidyl methacrylate copolymer, and 5.0 parts by mole of bismaleimide were introduced into an Erlenmeyer flask equipped with a stirrer, a thermometer, a reflux cooling tube, a titration device, and a nitrogen introduction tube, and the air in the Erlenmeyer flask is exchanged with nitrogen. Next, the reaction was carried out for 6 hours while raising the temperature to 110° C. and stirring. The synthesized alkali-soluble resin (A-2) had an acid value of 73.26 mg KOH/g, and a weight average molecular weight (Mw) of about 12,273 as measured by GPC.

Synthesis Example 3: Preparation of Alkali-Soluble Resin A-3

185 parts by mole of propylene glycol methyl ether acetate, 2.0 parts by mole of azobisisobutyronitrile (AIBN), 34.0 parts by mole of benzyl methacrylate, 23.0 parts by mole of acrylic acid, 21.0 parts by mole of styrene, and 22.0 parts by mole of acrylic acid-glycidyl methacrylate copolymer were introduced into an Erlenmeyer flask equipped with a stirrer, a thermometer, a reflux cooling tube, a titration device, and a nitrogen introduction tube, and the air in the Erlenmeyer flask is exchanged with nitrogen. Next, the reaction was carried out for 6 hours while raising the temperature to 110° C. and stirring. The synthesized alkali-soluble resin (A-3) had an acid value of 108.87 mg KOH/g, and a weight average molecular weight (Mw) of about 16,800 as measured by GPC.

Synthesis Example 4: Preparation of Alkali-Soluble Resin A-4

185 parts by mole of propylene glycol methyl ether acetate, 2.0 parts by mole of azobisisobutyronitrile (AIBN), 50.0 parts by mole of benzyl methacrylate, 25.0 parts by mole of acrylic acid, 10.0 parts by mole of methyl methacrylate, and 15.0 parts by mole of acrylic acid-glycidyl methacrylate copolymer were introduced into an Erlenmeyer flask equipped with a stirrer, a thermometer, a reflux cooling tube, a titration device, and a nitrogen introduction tube, and the air in the Erlenmeyer flask is exchanged with nitrogen. Next, the reaction was carried out for 6 hours while raising the temperature to 110° C. and stirring. The synthesized alkali-soluble resin (A-4) had an acid value of 112.70 mg KOH/g, and a weight average molecular weight (Mw) of about 28,380 as measured by GPC.

Synthesis Comparative Example 1: Preparation of Alkali-Soluble Resin A-5

200 parts by mole of 3-ethoxypropionate ethyl ester, 2.0 parts by mole of azobisisobutyronitrile (AIBN), 45.0 parts by mole of benzyl methacrylate, 10.0 parts by mole of hydroxyethyl methacrylate, 25.0 parts by mole of acrylic acid, and 20.0 parts by mole of methyl methacrylate were introduced into an Erlenmeyer flask equipped with a stirrer, a thermometer, a reflux cooling tube, a titration device, and a nitrogen introduction tube, and the air in the Erlenmeyer flask is exchanged with nitrogen. Next, the reaction was carried out for 6 hours while raising the temperature to 110° C. and stirring. The synthesized alkali-soluble resin (A-5) had an acid value of 108.91 mg KOH/g, and a weight average molecular weight (Mw) of about 40,786 as measured by GPC.

Preparation of Examples and Comparative Examples of Photosensitive Compositions Examples and comparative examples of red, green, and blue photosensitive compositions are prepared by the following steps according to the ratios listed in Tables 1, 2, and 3 below: (1) mixing a solvent with an alkali-soluble resin; (2) dissolving the photopolymerization initiator in the mixture of the step (1); (3) adding the ethylenically unsaturated monomer to be uniformly mixed with other components; and (4) adding the additive and the colorant, and stirring for another one hour to obtain respective photosensitive compositions.

The compounds corresponding to the abbreviations listed in Tables 1 to 3 are as follows: Ethylene unsaturated monomer (B)

B-1: a mixture of dipentaerythritol hexaacrylate and dipentaerythritol pentaacrylate (trade name: DPHA, NIPPON KAYAYU)

B-2: Ethylene oxide modified dipentaerythritol hexaacrylate (trade name: DPEA-12, NIPPON KAYAYU) Photopolymerization initiator (C)

C-1: Irgacure® OXE01 (BASF Corporation)
C-2: Irgacure® OXE02 (BASF Corporation)
C-3: Irgacure® 369 (BASF Corporation)
C-4: Irgacure® 907 (BASF Corporation)
C-5: Chemcure-MEK (Chembridge International Corp.)
C-6: TR-PBG-305 (Changzhou Tronly New Electronic Materials Co., Ltd.)
C-7: TR-PBG-304 (Changzhou Tronly New Electronic Materials Co., Ltd.)
Solvent (D)
D-1: ethyl 3-ethoxypropionate (high boiling point solvent) (MARCO TECHNOLOGY CORP.)
D-2: Propylene glycol monomethyl ether acetate (Dow Chemical Taiwan Co., Ltd.)
Colorant (E)
E-1: SREC-04 (T6) (C.I. Pigment Red 254, SKC Haas Display Films Co., Ltd.)
E-2: SREC-07 (C.I. Pigment Red 177, SKC Haas Display Films Co., Ltd.)
E-3: SGEC-06 (C.I. Pigment Green 36/C.I. Pigment Yellow 150=90/10, SKC Haas Display Films Co., Ltd.)
E-4: SGEC-07 (C.I. Pigment Green 36/C.I. Pigment Yellow 150=57/43, SKC Haas Display Films Co., Ltd.)
E-5: CFB-5104-RP1 (C.I. Pigment Blue 15:6, C&A Industrial Co., Ltd.)
E-6: CFB-5104(VR)-RP2 (C.I. Pigment Blue 15:6/C.I. Pigment Violet 23=70/30, C&A Industrial Co., Ltd.)
Additive (F)
F-1: BYK-307 (BYK Chemical Co., Ltd.)
Evaluation Method A. Resolution The prepared photosensitive composition was coated on a glass substrate by spin coating, and the glass substrate was placed on a hot plate maintained at a temperature of 90° C. for 2 minutes to form a film on the glass substrate. Subsequently, a test photomask having a line/space pattern of 1 to 50 µm and a pattern of progressively varying transmittance in the range of 1 to 100% is placed on the film, and UV irradiation was carried out by an interval of 50 µm between the film and the photomask as well as at 80 mJ/cm$^2$ using a 1 KW high-pressure mercury lamp. No special optical filter was used, and the mercury lamp contains all of g, h and i rays. The UV-irradiated film was immersed in an aqueous KOH solution (pH 10.5), as a developing solution, for 50 seconds. After development, the film was washed with distilled water and dried with nitrogen, followed by being heated in an oven set at 230° C. for 25 minutes to obtain a color filter. The obtained color filter was confirmed to have a thickness of 2.2 µm. With an electron microscope (Model: Olympus MX50), it was observed at 500 magnifications whether the line width patterns of different sizes were kept neat and the pattern was damaged or not to evaluate the resolution.

The evaluation criteria of the resolution are as follows:
⊚: a good pattern can be obtained with a line width of less than 10 μm;
○: a good pattern can be obtained with a line width of 10 μm to 20 μm;
Δ: a good pattern can be obtained with a line width of 20 μm to 30 μm;
X: a good pattern can be obtained only with a line width more than 30 μm.

B. Lens Uniformity

When the reactivity of the photosensitive composition is insufficient so that a uniform film thickness cannot be obtained after irradiation, a phenomenon of lens mura is caused. Therefore, the lens uniformity can be evaluated by comparing the thicknesses of the film generated from the photosensitive composition under a high-energy irradiation that may allow the photosensitive composition completely reacted and under a low-energy irradiation that is prone to have the photosensitive composition incompletely reacted.

The prepared photosensitive composition was coated on a glass substrate by spin coating, and the glass substrate was placed on a hot plate maintained at a temperature of 90° C. for 2 minutes to form a film on the glass substrate. Subsequently, a test photomask having a line/space pattern of 1 to 50 μm and a pattern of progressively varying transmittance in a range of 1 to 100% was placed on the film, and the UV irradiation was performed under 40 and 150 mJ/cm² respectively using a 1 KW high pressure mercury lamp by an interval of 50 μm between the film and the photomask. No special optical filter was used, and the mercury lamp contains all of g, h and i rays. The UV-irradiated film was immersed in an aqueous KOH solution (pH 10.5), as a developing solution, for 50 seconds. After development, the film was washed with distilled water and dried with nitrogen, followed by being heated in an oven set at 230° C. for 25 minutes to obtain a color filter. The total residual film was calculated by measuring the film thickness after exposure, development, and hard baking using VEECO's Dekrak 8 film thickness meter.

The total residual film difference k at 40 and 150 mJ/cm² was calculated according to the following equation:

$$k = \frac{(\text{film thickness of } 150 \text{ mJ/cm}^2) - (\text{film thickness of } 40 \text{ mJ/cm}^2)}{\text{film thickness of } 150 \text{ mJ/cm}^2} \times 100\%$$

The evaluation criteria for lens uniformity are as follows:
⊚: k is between 0 and 0.5%;
○: k is between 0.5% and 1.0%;
Δ: k is between 1.0% and 2.0%;
X: k exceeds 2.0%.

The evaluation results are provided in Tables 1 to 3.

TABLE 1

| Red photosensitive composition | | Examples | | | | | | | | Comparative Examples | | |
|---|---|---|---|---|---|---|---|---|---|---|---|---|
| composition | | 1 | 2 | 3 | 4 | 5 | 6 | 7 | 8 | 9 | 10 | 11 |
| alkali soluble resin (parts by weight) | A-1 | 150 | | | | | | | | | | |
| | A-2 | | 150 | 75 | 75 | 150 | 150 | 150 | 150 | 150 | 150 | |
| | A-3 | | | 75 | 75 | | | | | | | |
| | A-5 | | | | | | | | | | | 150 |
| ethylenically unsaturated monomer (parts by weight) | B-1 | 100 | 100 | 100 | 100 | 100 | 100 | 100 | 100 | 100 | 100 | 100 |
| photopolymerization initiator (parts by weight) | C-1 | 40 | 40 | 40 | | 30 | 30 | 26 | 56 | 8 | 64 | 40 |
| | C-2 | 10 | 10 | 10 | | 10 | 10 | 6 | 14 | 2 | 16 | 10 |
| | C-3 | | | | | 10 | | | | | | |
| | C-4 | | | | | | 10 | | | | | |
| | C-6 | | | | 40 | | | | | | | |
| | C-7 | | | | 10 | | | | | | | |
| solvent (parts by weight) | D-1 | 281 | 281 | 281 | 281 | 281 | 281 | 265 | 300 | 244 | 310 | 281 |
| | D-2 | 1966 | 1966 | 1966 | 1966 | 1966 | 1966 | 1852 | 2102 | 1707 | 2167 | 1966 |
| colorant (parts by weight) | E-1 | 90 | 90 | 90 | 90 | 90 | 90 | 84 | 96 | 78 | 99 | 90 |
| | E-2 | 107 | 107 | 107 | 107 | 107 | 107 | 101 | 114 | 93 | 118 | 107 |
| additive (parts by weight) | F-1 | 65 | 65 | 65 | 65 | 65 | 65 | 62 | 70 | 57 | 72 | 65 |
| photopolymerization initiator/ ethylenically unsaturated monomer | C/B | 0.5 | 0.5 | 0.5 | 0.5 | 0.5 | 0.4 | 0.32 | 0.7 | 0.1 | 0.8 | 0.5 |
| Evaluation | lens uniformity | ⊚ | ⊚ | ⊚ | ⊚ | ○ | ○ | ○ | ○ | X | Δ | X |
| | Resolution | ○ | ⊚ | ⊚ | ⊚ | ⊚ | ⊚ | ⊚ | ⊚ | ○ | ○ | X | ○ |

TABLE 2

| Green photosensitive composition | | Examples | | | | | | | | Comparative Examples | | |
|---|---|---|---|---|---|---|---|---|---|---|---|---|
| composition | | 1 | 2 | 3 | 4 | 5 | 6 | 7 | 8 | 9 | 10 | 11 |
| alkali soluble resin (parts by weight) | A-1 | 150 | | | 150 | 150 | 150 | 151 | 150 | 150 | 150 | |
| | A-2 | | 150 | | | | | | | | | |
| | A-3 | | | 75 | | | | | | | | |
| | A-4 | | | 75 | | | | | | | | |
| | A-5 | | | | | | | | | | | 150 |
| ethylenically unsaturated monomer (parts by weight) | B-1 | 100 | 100 | 100 | 100 | 100 | 50 | 100 | 100 | 100 | 100 | 100 |
| | B-2 | | | | | | 50 | | | | | |
| photopolymerization initiator (parts by weight) | C-1 | 30 | 30 | 30 | | 20 | 30 | 19 | 42 | 6 | 48 | 30 |
| | C-2 | 20 | 20 | 20 | | 20 | 20 | 13 | 28 | 4 | 32 | 20 |
| | C-3 | | | | | 10 | | | | | | |
| | C-6 | | | | 30 | | | | | | | |
| | C-7 | | | | 20 | | | | | | | |
| solvent (parts by weight) | D-1 | 266 | 266 | 266 | 266 | 266 | 266 | 252 | 286 | 231 | 295 | 266 |
| | D-2 | 1862 | 1862 | 1862 | 1862 | 1862 | 1862 | 1763 | 2000 | 1620 | 2065 | 1862 |
| colorant (parts by weight) | E-3 | 143 | 143 | 143 | 143 | 143 | 143 | 136 | 154 | 125 | 159 | 143 |
| | E-4 | 27 | 27 | 27 | 27 | 27 | 27 | 26 | 29 | 24 | 30 | 27 |
| additive (parts by weight) | F-1 | 62 | 62 | 62 | 62 | 62 | 62 | 58 | 66 | 54 | 68 | 62 |
| photopolymerization initiator/ ethylenically unsaturated monomer | C/B | 0.5 | 0.5 | 0.5 | 0.5 | 0.5 | 0.5 | 0.32 | 0.7 | 0.1 | 0.8 | 0.5 |
| Evaluation | lens uniformity | ◎ | ◎ | ◎ | ◎ | ◎ | ○ | ○ | ○ | X | Δ | Δ |
| | Resolution | ◎ | ○ | ○ | ◎ | ◎ | ◎ | ◎ | ○ | Δ | X | X |

TABLE 3

| Blue photosensitive composition | | Examples | | | | | | | | | Comparative Examples | | |
|---|---|---|---|---|---|---|---|---|---|---|---|---|---|
| composition | | 1 | 2 | 3 | 4 | 5 | 6 | 7 | 8 | 9 | 10 | 11 | 12 |
| alkali soluble resin (parts by weight) | A-1 | 150 | | | | | | | | | | | |
| | A-2 | | 150 | | | | | | | | | | |
| | A-3 | | | 150 | 150 | 75 | 150 | 150 | 150 | 150 | 150 | 150 | |
| | A-4 | | | | | 75 | | | | | | | |
| | A-5 | | | | | | | | | | | | 150 |
| ethylenically unsaturated monomer (parts by weight) | B-1 | 100 | 100 | 100 | 100 | 100 | 100 | 100 | 100 | 100 | 100 | 100 | 100 |
| photopolymerization initiator (parts by weight) | C-1 | 25 | 25 | 25 | | 25 | 20 | 20 | 16 | 35 | 5 | 40 | 25 |
| | C-2 | 25 | 25 | 25 | | 25 | 20 | 20 | 16 | 35 | 5 | 40 | 25 |
| | C-3 | | | | | | 10 | | | | | | |
| | C-5 | | | | | | | 10 | | | | | |
| | C-6 | | | | 25 | | | | | | | | |
| | C-7 | | | | 25 | | | | | | | | |
| solvent (parts by weight) | D-1 | 219 | 219 | 219 | 219 | 219 | 219 | 219 | 206 | 235 | 190 | 241 | 219 |
| | D-2 | 1535 | 1535 | 1535 | 1535 | 1535 | 1535 | 1535 | 1443 | 1643 | 1331 | 1687 | 1535 |
| colorant (parts by weight) | E-5 | 50 | 50 | 50 | 50 | 50 | 50 | 50 | 47 | 53 | 43 | 55 | 50 |
| | E-6 | 50 | 50 | 50 | 50 | 50 | 50 | 50 | 47 | 53 | 43 | 55 | 50 |
| additive (parts by weight) | F-1 | 39 | 39 | 39 | 39 | 39 | 39 | 39 | 37 | 42 | 34 | 43 | 39 |
| photopolymerization initiator/ethylenically unsaturated monomer | C/B | 0.5 | 0.5 | 0.5 | 0.5 | 0.5 | 0.5 | 0.4 | 0.32 | 0.7 | 0.1 | 0.8 | 0.5 |
| Evaluation | lens uniformity | ◎ | ◎ | ◎ | ◎ | ◎ | ○ | ◎ | ○ | ○ | X | Δ | X |
| | Resolution | ○ | ○ | ◎ | ◎ | ○ | ◎ | ◎ | ◎ | ○ | X | Δ | Δ |

Referring to the evaluation results of the red photosensitive composition of Table 1, Examples 1 to 8 of the present invention each had excellent resolution and lens uniformity. The amount of the photopolymerization initiator (C) used in Comparative Example 9 was too small, so that a good lens uniformity could not be obtained. Since the photopolymerization initiator (C) of Comparative Example 10 was used in an excessive amount, the resolution was deteriorated. Comparative Example 11 shows that when the monomer represented by the formula (1) is not included in the alkali-soluble resin, a lens mura phenomenon occurs.

With reference to the evaluation results of the green photosensitive composition of Table 2, Examples 1 to 8 of the present invention each had excellent resolution and lens uniformity. The amount of the photopolymerization initiator (C) used in Comparative Example 9 was too small, so that a good lens uniformity could not be obtained. Since the photopolymerization initiator (C) of Comparative Example 10 was used in an excessive amount, the resolution was deteriorated. Comparative Example 11 shows that when the monomer represented by the formula (1) is not included in the alkali-soluble resin, a lens mura phenomenon occurs.

Referring to the evaluation results of the blue photosensitive composition of Table 3, Examples 1 to 9 of the present invention each had excellent resolution and lens uniformity. The amount of the photopolymerization initiator (C) used in Comparative Example 10 was too small, so that a good lens uniformity could not be obtained. When the amount of the photopolymerization initiator (C) of Comparative Example 11 was too high, good lens uniformity and good resolution could not be obtained. Comparative Example 12 shows that when the monomer represented by the formula (1) is not included in the alkali-soluble resin, a lens mura phenomenon occurs.

In view of above, when the photosensitive composition of the present invention is used for patterning, a uniform and high-resolution pattern can be obtained, and lens mura phenomenon of the color filter can be improved.

While the principles of the disclosure have been described above in connection with specific compositions and methods, it is to be clearly understood that this description is made only by way of example and not as limitation on the scope of the present teachings.

What is claimed is:

1. A color photosensitive composition, comprising:
an alkali-soluble resin (A);
an ethylenically unsaturated monomer (B);
an oxime ester-based photopolymerization initiator (C);
a solvent (D); and
a colorant (E),
wherein the content of the alkali-soluble resin (A) is from 100 parts by weight to 200 parts by weight based on 100 parts by weight of the ethylenically unsaturated monomer (B),
wherein the content of the oxime ester-based photopolymerization initiator (C) is from 32 parts by weight to 70 parts by weight based on 100 parts by weight of the ethylenically unsaturated monomer (B),
wherein the content of the solvent (D) is from 1649 parts by weight to 2402 parts by weight based on 100 parts by weight of the ethylenically unsaturated monomer (B),
wherein the colorant (E) is from 30 parts by weight to 300 parts by weight based on 100 parts by weight of the ethylenically unsaturated monomer (B), wherein the alkali-soluble resin (A) is formed with monomers, wherein based on total moles of the monomers forming the alkali-soluble resin (A), the monomers comprise:
15 mol % to 35 mol % of a monomer represented by the formula (1):

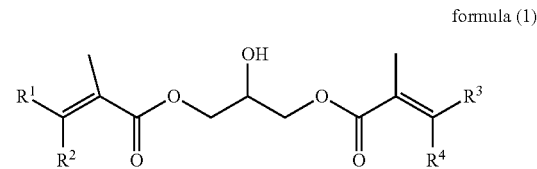

formula (1)

wherein $R^1$ to $R^4$ are each independently hydrogen, methyl group or ethyl group;
20 mol % to 30 mol % of unsaturated carboxylic acid or unsaturated carboxylic anhydride; and
40 mol % to 60 mol % of one or more monomers selected from the group consisting of an acrylic compound, a styrene-based compound, and a maleimide-based compound, the oxime ester-based photopolymerization initiator (C) comprises at least a compound represented by formula (2) and at least a compound represented by formula (3) in a weight ratio of 4:1 to 1:1,

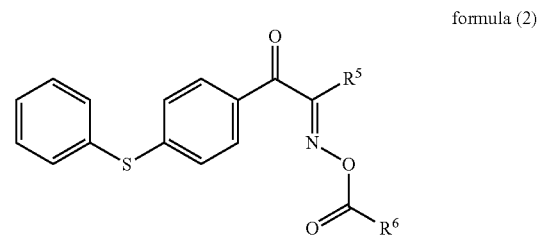

formula (2)

wherein $R^5$ and $R^6$ are each independently hydrogen, C1-C20 alkyl group, C3-C8 cycloalkyl group, C2-C5 alkenyl group, substituted or unsubstituted C6-C20 aryl, or C7-C20 heteroaryl group,

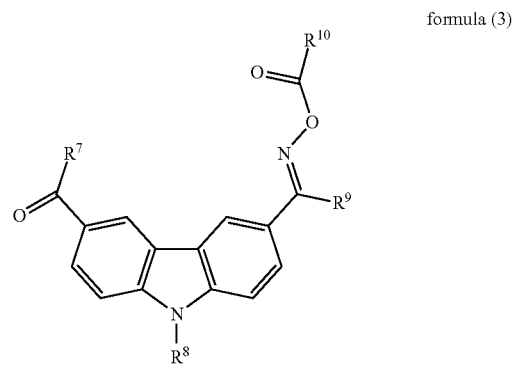

formula (3)

wherein $R^7$ is substituted or unsubstituted C6-C20 aryl group, or C7-C20 heteroaryl group,
$R^8$ is C1-C20 alkyl group, C2-C5 alkenyl group, C3-C10 cycloalkyl group, phenyl, or benzyl group, and R⁹ and R¹⁰ are each independently C1-C20 alkyl group, C3-C8 cycloalkyl group, C2-C5 alkenyl group, substituted or unsubstituted C6-C20 aryl group, or C7-C20 heteroaryl group, wherein the color photosensitive composition does not comprise C.I. Pigment Black 1, C.I. Pigment Black 7, titanium black, synthetic iron black, and carbon black, and the color photosensitive composition has a total residual film difference k between 0 and 1.0%, the total residual film difference k is calculated according to the following equation:

$$k = \frac{(\text{film thickness of 150 mJ/cm}^2) - (\text{film thickness of 40 mJ/cm}^2)}{\text{film thickness of 150 mL/cm}^2} \times 100\%$$

the film thickness of 150 mJ/cm² and the film thickness of 40 mJ/cm² are a thickness of a film obtained by UV-irradiating the color photosensitive composition under 150 mJ/cm² and 40 mJ/cm², respectively.

2. The color photosensitive composition of claim 1, wherein the colorant (E) comprises an organic pigment, an inorganic pigment or a combination thereof.

3. The color photosensitive composition of claim 2, wherein the organic pigment comprises diketopyrrolopyrrole-type pigment, anthraquinone-type pigment, dianthraquinone-type pigment, phthalocyanine-type pigment, benzimidazolone-type pigment, dioxazine-type pigment, azo-type pigment, thiazinium blue-type pigment, quinacridone-type pigment or a combination thereof.

4. The color photosensitive composition of claim 1, wherein the solvent (D) comprises a mixture of propylene glycol methyl ether acetate and a high boiling point solvent having a boiling point more than 145° C.

5. The color photosensitive composition of claim 4, wherein a weight ratio of the propylene glycol methyl ether acetate to the high boiling points solvent is 7:1 to 2:1.

6. The color photosensitive composition of claim 4, wherein the high boiling point solvent comprises ethyl 3-ethoxypropionate (EEP), ethyl pyruvate (PE), ethyl lactate, butyl lactate, benzyl alcohol, 3-methoxybutyl acetate (MBA), 3-methoxy 3-methylbutanol, γ-butyrolactone, or propylene glycol monobutyl ether.

7. A method of forming a color filter, comprising:
coating the color photosensitive composition of claim 1 on a surface of a substrate.

8. A color filter, comprising:
a colored layer formed by curing the color photosensitive composition of claim 1.

* * * * *